United States Patent [19]

Goronkin et al.

[11] Patent Number: 5,160,982

[45] Date of Patent: Nov. 3, 1992

[54] PHONON SUPPRESSION IN QUANTUM WELLS

[75] Inventors: Herbert Goronkin, Tempe; X. Theodore Zhu, Chandler; George N. Maracas, Tempe, all of Ariz.

[73] Assignee: Motorola, Inc., Schaumburg, Ill.

[21] Appl. No.: 895,228

[22] Filed: Jun. 8, 1992

Related U.S. Application Data

[63] Continuation of Ser. No. 724,014, Jul. 1, 1991, abandoned.

[51] Int. Cl.$^5$ ............... H01L 27/12; H01L 29/161; H01L 33/00
[52] U.S. Cl. ........................ 257/23; 257/192; 257/196
[58] Field of Search ............... 357/4, 16, 17

[56] References Cited

U.S. PATENT DOCUMENTS

| | | | |
|---|---|---|---|
| 4,772,934 | 9/1988 | Cunningham et al. | 357/16 |
| 4,799,091 | 1/1989 | Reed | 357/16 |
| 4,819,036 | 4/1989 | Kuroda et al. | 357/16 |
| 4,937,204 | 6/1990 | Ishibashi et al. | 437/110 |
| 5,010,376 | 4/1991 | Nishimura et al. | 357/16 |
| 5,060,234 | 10/1991 | Schubert et al. | 357/4 |

FOREIGN PATENT DOCUMENTS

| | | | |
|---|---|---|---|
| 61-210679 | 9/1986 | Japan | 357/16 |
| 62-1277 | 1/1987 | Japan | 357/16 |
| 2-134830 | 5/1990 | Japan | 357/16 |

OTHER PUBLICATIONS

Amor et al., "Two-Dimensional Electron Gas at a GaInAs (AlGa) InAs Interface", Appl. Phys. Lett., vol. 53, #6, Aug. 8, 1988, pp. 479-481.

Ishibashi et al., "Raman scattering from $(AlAs)_m$-$(GaAs)_n$ ultrathin-layer superlattices", Physical Review B, vol. 33, No. 4, Feb. 15, 1986.

Primary Examiner—Rolf Hille
Assistant Examiner—Mahshid Saadat
Attorney, Agent, or Firm—Stuart T. Langley

[57] ABSTRACT

An enhanced mobility semiconductor comprising a host quantum well having at least two charge carrier barrier layers of a wide bandgap material, each of the two charge carrier barrier layers being separated by a conducting region containing charge carriers is provided. A number of phonon barriers having a predetermined thickness are formed in the conducting region wherein the predetermined thickness is chosen to allow charge carrier tunneling through the phonon barriers.

12 Claims, 2 Drawing Sheets

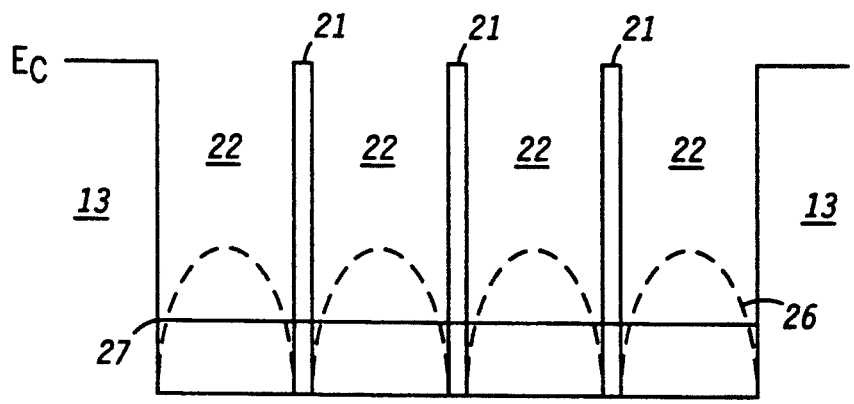
FIG. 1
FIG. 2
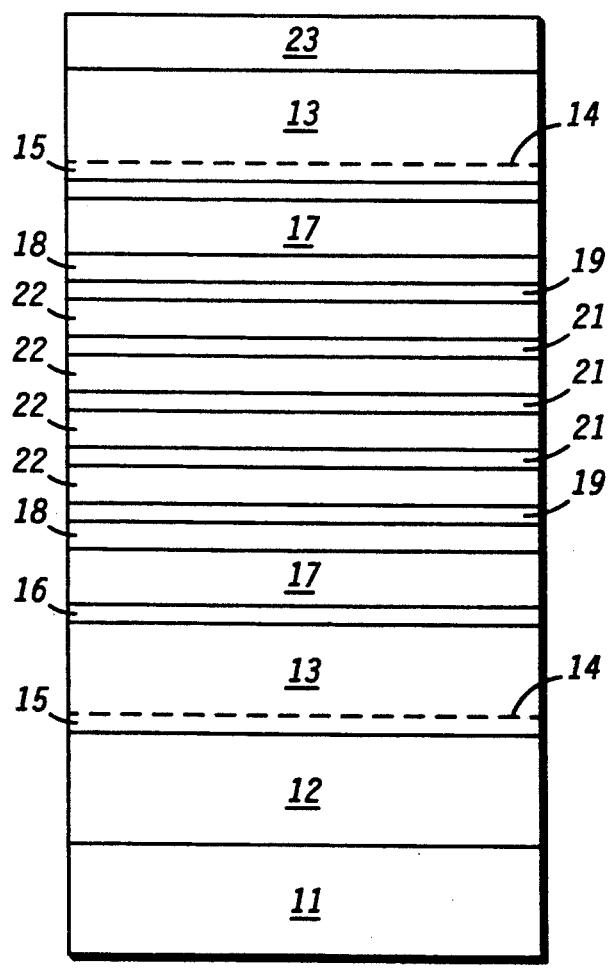

PHONON SUPPRESSION IN QUANTUM WELLS

This application is a continuation of prior application Ser. No. 07/724,014, filed Jul. 1, 1991, now abandoned.

BACKGROUND OF THE INVENTION

This invention relates, in general, to quantum well devices, and more particularly, to a high mobility quantum well structure.

Semiconductor devices, such as bipolar and field effect transistors, can consist of multiple layers of semiconducting or insulating materials. Charge carriers (holes and electrons) move through the layers of the semiconductor device. Performance and efficiency of the semiconductor device is largely determined by mobility of the charge carriers in the semiconductor layers.

Bulk semiconductor materials have characteristic mobility which determines usefulness of the semiconductor material for device processing. Compound semiconductors, for example, are known to have higher mobility than silicon and thus are preferred for high performance devices. Characteristic mobility of a semiconductor material, however, is degraded by crystal imperfections, doping impurities, and the like. Mobility also decreases as a result of interactions of charge carriers with phonons of the crystal lattice.

While extensive work has been done to reduce mobility degradation caused by impurities and defects in semiconductors, it has been widely accepted that mobility degradation caused by electron interaction with bulk phonons can not be reduced. In addition to phonons associated with bulk materials, interface phonons are generated at an interface between semiconductor layers of different composition. In the past, it was believed that mobility degradation caused by electron-phonon interactions was best limited by designing structures with as few interfaces, and thus as few semiconductor layers as possible.

In a bulk material electrons and phonons are distributed uniformly. Interaction between the two is proportional to the product of the densities and it is thus constant throughout the sample. What is needed is a semiconductor material structure which confines phonons to control phonon distribution, reducing electron-phonon interaction and improving mobility.

SUMMARY OF THE INVENTION

The objects and advantages of the present invention are achieved by an enhanced mobility semiconductor comprising a host quantum well having at least two charge carrier barrier layers of a wide bandgap material, each of the two charge carrier barrier layers being separated by a conducting region containing charge carriers. A number of phonon barriers having a predetermined thickness are formed in the conducting region wherein the predetermined thickness is chosen to allow charge carrier tunneling through the phonon barriers.

BRIEF DESCRIPTION OF THE DRAWINGS

FIG. 1 illustrates a high simplified conduction band diagram illustrating an embodiment of the present invention;

FIG. 2 illustrates, in cross-sectional form, a material structure in accordance with the present invention.

DETAILED DESCRIPTION OF THE DRAWINGS

Figure 3:
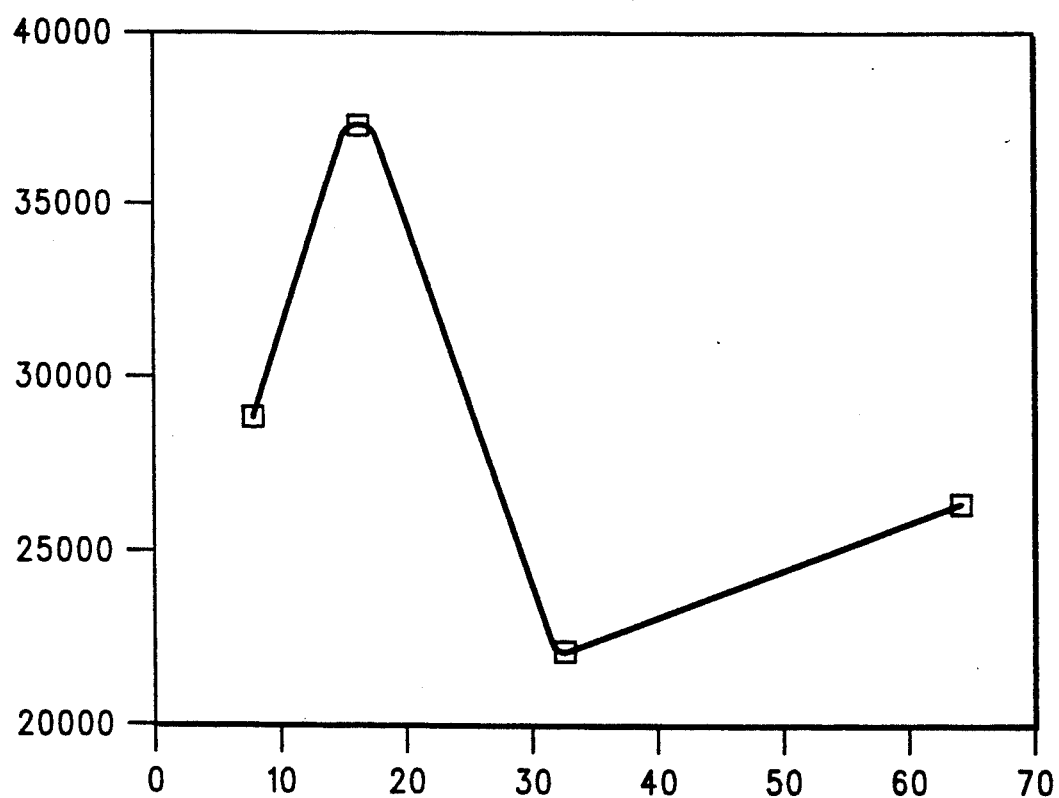
FIG. 3 illustrates mobility as a function of phonon well width in the embodiment shown in FIG. 2.

FIG. 1 illustrates a highly simplified conduction band diagram illustrating a portion of a structure in accordance with the present invention. It should be understood that the conduction band diagram of FIG. 1 is extremely simplified for ease of description and that various anomalies which actually appear in a conduction band of a semiconductor device are not illustrated. The high mobility semiconductor structure of the present invention would be used in an electronic device as a channel region of a heterojunction field effect transistor, for example.

Although the preferred embodiments of the present invention are described in terms of an N-type conductivity device where the charge carriers are electrons, it should be understood that P-type conductivity devices having holes as charge carriers may also be used. Although referred to as an enhanced conductivity semiconductor structure, it should be understood that semi-insulating compound materials may be used where appropriate. A great deal of latitude is available in material choice so long as the energy band relationships and other solid state characteristics described hereinbelow are maintained. Accordingly, these variations are within the scope of the present invention.

FIG. 1 illustrates a host quantum well in which charge carriers are confined by charge carrier barrier layers 13. Barrier layers 13 comprise a wide bandgap material creating a sufficient bandgap discontinuity to confine charge carriers within the quantum well. Charge carrier barriers 13 are separated by a conducting region comprising a plurality of conductive layers 22 and phonon barriers 21. As described in more detail hereinbelow, phonon barriers 21 are sufficiently thin so that charge carriers (electrons) can easily tunnel between adjacent conductive layers 22. Thus, so far as charge carriers are concerned the host quantum well is essentially a large quantum well having a continuous electron distribution illustrated by line 27.

Although charge carrier distribution is illustrated as completely uniform through the host quantum well, it should be understood that in reality charge distribution will be non-uniform to some extent even in a large quantum well. Also, although phonon barriers 21 are designed to be transparent to charge carriers, they will in reality affect charge carrier distribution to some extent. It is sufficient to the understanding of the present invention, however, to view charge carrier distribution 27 as uniform.

Dashed lines 26 in FIG. 1 illustrate distribution of longitudinal optical phonons in phonon wells 22. Because phonons can not pass through phonon barriers 21 their distribution must fall to nearly zero at the edges of each phonon barrier 21. These barriers prohibit phonons in conductive layers 22 from penetrating into adjacent conductive layers 22. Conductive layers 22 are sandwiched between two phonon barriers; it may be conceptually useful to view conductive layers 22 so arranged as phonon wells in which phonons are confined. Accordingly, conductive layers 22 may alternatively be referred to as phonon wells 22.

Phonon barriers 21 comprise a material having a different elastic constant than the elastic constant of conductive layers 22, also called phonon wells 22. Each interface between a phonon well 22 and a phonon barrier 21 thus results in a discontinuity in elastic constant.

Because phonons are mechanical energy, the discontinuity prevents phonons for passing through the phonon barrier. Thickness of phonon barriers 21 is immaterial from the standpoint of confining phonon distribution. Thickness of phonon wells can, of course, effect electron transport between conductive layers 22. A wide range of material compositions can be used for phonon barriers 21 so long as the requirement for a different elastic constant is met.

As shown, phonon distribution 26 has nodes at edges of each conductive layer 22. The optical phonons are confined by phonon barriers 21 in at least one dimension while electrons are able to move in three dimensions within the large quantum well. As illustrated in FIG. 1, phonon barriers 21 may comprise a wide bandgap material, resulting in electron distribution 27 having a small minimum at the location of each phonon barrier 21 and a node at each of the two edges of the host quantum well. It can be seen that the product of the distributions along each of the four wells varies from nearly zero at the edges of each conductive layer 22 (neglecting interface phonons) to a value equal to bulk material near the center of each conductive layer 22. When these contributions are added up along the well, the total electron-phonon interaction is less than for a bulk semiconductor.

FIG. 2 illustrates a more complex structure embodying the present invention, but with additional features to introduce electrons into conductive layers 22. As shown in FIG. 2 the multi-layer structure of the present invention is desirably formed on a semi-insulating crystal substrate 11. In a preferred embodiment, substrate 11 comprising gallium arsenide which is a convenient, low cost substrate available in the industry. Semi-insulating substrate 11 is covered by a buffer layer 12 which serves primarily as a barrier preventing mechanical defects in substrate 11 from propagating upward to the multi-layer structure of the present invention. Buffer 12 comprises 0.5 micrometers of undoped gallium arsenide in a preferred embodiment.

It is useful to think of the structure shown in FIG. 2 in three functional segments. First, layers 13-15 form barriers of a host quantum well and serve to supply free charge carriers to the host quantum well. Second, transfer wells 16 and 18 together function to transfer charge carriers to a central portion of the host quantum well. Third, conductive layers 22 and phonon barriers 21 embody the high mobility structure of the present invention, as described in reference to FIG. 1. Conductive layers 22 together with the transfer wells form the host quantum well.

In order to induce electrons into conductive layers 22, barrier layers 13 are planar doped with silicon. Barriers 13 are adapted to introduce charge carriers into the structure by providing a planar doping layer 14 which provides excess electrons. Planar doping layer 14 is covered by spacer layer 15. Barriers 13 and spacers 15 conveniently comprise epitaxially grown aluminum arsenide (AlAs). In one experimental structure barriers 13 comprised 300 angstroms of AlAs, planar doping layers 15 had a concentration in the order of $1 \times 10^{12}$ atoms/cm$^2$, and spacers 15 comprised 30 angstroms of AlAs.

Electrons tunneling into the host quantum well will be attracted to their parent donor ions and congregate near barriers 13. This will pull the edges downward in energy towards the Fermi level while the center will remain high. Such band bending will destroy relative uniformity of electron distribution 27 shown in FIG. 1.

In order to keep energy bands flat, transfer wells comprising semiconductor layers 16, 17, 18, and 19 are formed between charge carrier barriers 13 and conductive layers 22. Using transfer wells, electron distribution peaks in conductive layers 22 and is relatively equal in each conductive layer 22.

First transfer well 16 comprises a thin conductive layer which initially receives charge carriers provided by planar doping layer 14. In a preferred embodiment first transfer well 16 comprises three monolayers of GaAs. Since these wells are thin quantized energy levels are high compared to quantized energy levels of the inner quantum wells so that electrons are readily transferred through transfer well 16 to second transfer well 18. First transfer well 16 is separated from second transfer well 18 by a high bandgap material 17. In a preferred embodiment layer 17 comprises nine monolayers of aluminum arsenide.

Second transfer well 18 functions similarly to first transfer well 16. Second transfer well 18 is designed to have lower quantized energy states than first transfer well 16 yet higher quantized energy states than conductive layers 22. Thus, electrons are readily transferred from transfer well 16 to second transfer well 18 and from second transfer well 18 to conductive layers 22. The function and effectiveness of transfer wells 16 and 18 is described in more detail in a co-pending patent application by one of the inventors of the present invention, Ser. No. 533,214 filed on Jun. 4, 1990.

Conductive layers 22 and phonon barriers 21 are formed in a central portion of the host quantum well. Conductive layers 22 have a predetermined thickness which is critical in achieving a high mobility performance of the present invention. As conductive layers 22 become thicker, they begin to resemble bulk semiconductor and mobility of charge carriers is limited by constraints that affect bulk semiconductor. As conductive layers 22 become thinner, however, interface phonons which are generated at edges of each conductive layer 22 are believed to significantly interact with electrons in conductive layers 22 and significantly decrease mobility.

As an example, when gallium arsenide is used for conductive layers 22 and aluminum arsenide is used for phonon barriers 21, conductive layers 22 should be in the range of 10-30 monomolecular layers thick to achieve maximum mobility. Interestingly, conventional teaching suggests that placing phonon barrier layers 21 inside a host quantum well would decrease mobility in conductive layers 22 due to the affect of interface phonons which would otherwise not be present. However, as shown in FIG. 3 it has been found that when conductive layers 22 are of a critical thickness, longitudinal optical phonon interference is reduced so significantly that it outweighs the affect of the interface phonons and results in unexpectedly improved mobility. This mobility is improved over what is normal for a bulk semiconductor without phonon barriers 21.

FIG. 3 graphically illustrates the increase in mobility as a function of the thickness of conductive layers 22. Horizontal axis in FIG. 3 represents thickness of conductive layers 22, while the vertical axis represents mobility in units of cm$^2$/Volt-Second. A dramatic peak in mobility occurs at a critical thickness in the range 10-30 monomolecular layers for thickness of quantum wells 22. It should be understood that the critical thickness will vary as different materials are used for conductive layers 22 and phonon barriers 21. This is because each material has characteristic phonon spectra and each interface between two materials has a characteristic interface phonon spectra which are unique to the particular materials chosen. Thus, the particular thickness of conductive layers 22 at which mobility peaks will be a function of the materials chosen. FIG. 3 illustrates mobility measurements taken from experimental samples at temperature of 120K. Experimental results obtained at other temperatures indicate that mobility increases at all temperatures when the critical thickness is provided.

By now it should be appreciated that a high mobility multilayer semiconductor structure is provided. By placing a plurality of phonon barriers within a host quantum heel, phonons in the quantum well can be confined, thus controlling electron-phonon interactions which degrade mobility in bulk semiconductors. The phonon barriers are substantially transparent to charge carriers in the hose quantum weel, resulting in a substantially uniform charge carrier density in the host quantum well. Conductive layers which make up the host quantum well have a predetermined thickness which minimizes phonon-electron interaction thus maximizing mobility for the semiconductor material.

We claim:

1. An enhanced mobility semiconductor comprising: a quantum well comprising at least two charge carrier barrier layers of a wide bandgap material, each of the two charge carrier barrier layers being separated by a conductive layer containing charge carriers, wherein each conducting layer is at least ten monolayers thick; and a number of phonon barriers having a predetermined thickness formed in the conducting layer, wherein the predetermined thickness is chosen to allow charge carrier tunneling through the phonon barriers and the phonon barriers comprise a material having a substantially different elastic constant than the conducting layer, wherein the phonon barriers are separated from each other by a predetermined spacing chosen to minimize charge carrier interaction with phonons in the conducting layer and with interface phonons generated at an interface between the phonon barriers and the conducting layer.

2. The semiconductor of claim 1 further comprising planar doping layers formed in the charge carrier barrier layers.

3. The semiconductor of claim 2 further comprising a transfer well formed in the conducting layer between an outermost phonon barrier and one of the charge carrier barrier layers.

4. The semiconductor of claim 1 wherein the phonon barriers comprise aluminum arsenide, the conducting layer comprises gallium arsenide, the at least two charge carrier barrier layers comprise aluminum arsenide, and the predetermined spacing is in the range of ten to thirty monomolecular layers of gallium arsenide.

5. An enhanced mobility semiconductor comprising: a crystal substrate having a surface; a plurality of superimposed layers of semiconductor material disposed on the substrate essentially parallel to the surface, at least two of the layers being conducting layers containing charge carriers, each of the at least two conducting layers being separated by a phonon barrier which prohibits phonons of a first of the at least two conducting layers from penetrating into a second of the at least two conducting layers, wherein the phonon barrier comprises a material with a different elastic constant than the at least two conducting layers and the at least two conducting layers have a predetermined thickness greater than ten monolayers, wherein the predetermined thickness is chosen to minimize interaction between the charge carriers and interface phonons at an interface between the conducting layers and the phonon barriers.

6. The semiconductor of claim 5 wherein the phonon barrier allows the charge carriers to tunnel from the first conducting layer to the second conducting layer.

7. The semiconductor of claim 5 wherein the at least two conducting layers comprise gallium arsenide and the phonon barrier comprises aluminum arsenide.

8. The semiconductor of claim 5 wherein the phonon barrier confines the phonons of the at least two conducting layers in at least one dimension.

9. The semiconductor of claim 7 wherein the predetermined thickness is in the range of ten to thirty monomolecular layers of gallium arsenide.

10. An enhanced mobility semiconductor comprising: first and second phonon barriers comprising a wide bandgap material; at least two phonon wells of a predetermined minimum thickness greater than ten monolayers formed between the first and second phonon barriers, each of the at least two phonon wells being separated by a third phonon barrier, wherein the phonon wells comprise a material with a different elastic constant than the phonon barriers, thereby confining phonons within the at least two phonon wells, wherein the third phonon barrier is sufficiently thin to allow significant charge carrier tunneling through the third phonon barrier and the predetermined minimum thickness is chosen to minimize charge carrier interaction with interface phonons.

11. The semiconductor of claim 1 wherein the phonon wells are conductive layers containing charge carriers.

12. The semiconductor of claim 10 wherein the phonon wells comprise gallium arsenide, the phonon barriers comprise aluminium arsenide, and the predetermined thickness is in the range of ten to thirty monomolecular layers.

* * * * *

UNITED STATES PATENT AND TRADEMARK OFFICE
CERTIFICATE OF CORRECTION

PATENT NO. : 5,160,982
DATED : November 3, 1992
INVENTOR(S) : Goronkin et al.

It is certified that error appears in the above-indentified patent and that said Letters Patent is hereby corrected as shown below:

Column 5, claim 1, line 32, delete "conductive" and insert therefor --conducting--.

Column 6, claim 11, line 49, delete "1" and insert therefore --10--.

Signed and Sealed this

Twenty-first Day of November, 1995

Attest:

BRUCE LEHMAN

Attesting Officer

Commissioner of Patents and Trademarks